(12) United States Patent
Herbsommer et al.

(10) Patent No.: US 10,251,258 B2
(45) Date of Patent: Apr. 2, 2019

(54) DIELECTRIC WAVEGUIDE CORE BETWEEN GROUND PLANES SECURED IN A CHANNEL

(71) Applicant: TEXAS INSTRUMENTS INCORPORATED, Dallas, TX (US)

(72) Inventors: Juan A. Herbsommer, Allen, TX (US); Robert F. Payne, Lucas, TX (US); Marco Corsi, Oak Point, TX (US); Baher S. Haroun, Allen, TX (US); Hassan Ali, Murphy, TX (US)

(73) Assignee: Texas Instruments Incorporated, Dallas, TX (US)

( * ) Notice: Subject to any disclaimer, the term of this patent is extended or adjusted under 35 U.S.C. 154(b) by 24 days.

(21) Appl. No.: 15/195,415

(22) Filed: Jun. 28, 2016

(65) Prior Publication Data
US 2016/0309581 A1    Oct. 20, 2016

Related U.S. Application Data

(62) Division of application No. 13/439,557, filed on Apr. 4, 2012, now Pat. No. 9,405,064.

(51) Int. Cl.
*G02B 6/12* (2006.01)
*H01P 3/12* (2006.01)
(Continued)

(52) U.S. Cl.
CPC ....... *H05K 1/0239* (2013.01); *G02B 6/12004* (2013.01); *G02B 6/1228* (2013.01);
(Continued)

(58) Field of Classification Search
CPC .. H05K 1/0239; H05K 1/0243; H05K 1/0274; H05K 1/18; H05K 1/115;
(Continued)

(56) References Cited

U.S. PATENT DOCUMENTS 3,932,823 A * 1/1976 Lavedan et al. ............ 333/21 R
5,054,870 A * 10/1991 Losch et al. .................... 385/14
(Continued)

FOREIGN PATENT DOCUMENTS

CN      102074515 A    5/2011
KR    1020100071668 A    6/2010

OTHER PUBLICATIONS

Search Report, dated May 21, 2017 from CN counterpart application.

*Primary Examiner* — David M Sinclair
*Assistant Examiner* — Theron S Milliser
(74) *Attorney, Agent, or Firm* — Lawrence J. Bassuk; Charles A. Brill; Frank D. Cimino

(57) ABSTRACT

An apparatus is provided. There is a circuit assembly with a package substrate and an integrated circuit (IC). The package substrate has a microstrip line, and the IC is secured to the package substrate and is electrically coupled to the microstrip line. A circuit board is also secured to the package substrate. A dielectric waveguide is secured to the circuit board. The dielectric waveguide has a dielectric core that extends into a transition region located between the dielectric waveguide and the microstrip line, and the microstrip line is configured to form a communication link with the dielectric waveguide.

18 Claims, 9 Drawing Sheets

(51) Int. Cl.
  *H01P 3/16* (2006.01)
  *H05K 1/02* (2006.01)
  *H05K 1/11* (2006.01)
  *H05K 1/18* (2006.01)
  *G02B 6/122* (2006.01)

(52) U.S. Cl.
  CPC .............. *H01P 3/121* (2013.01); *H01P 3/16* (2013.01); *H05K 1/025* (2013.01); *H05K 1/0243* (2013.01); *H05K 1/0274* (2013.01); *H05K 1/115* (2013.01); *H05K 1/18* (2013.01); *H01L 2223/6627* (2013.01); *H01L 2224/16227* (2013.01); *H01L 2924/15311* (2013.01); *H05K 2201/0187* (2013.01); *H05K 2201/037* (2013.01); *H05K 2201/09618* (2013.01); *H05K 2201/10098* (2013.01)

(58) Field of Classification Search
  CPC .. H05K 1/025; G02B 6/12004; G02B 6/1228; H01P 3/121; H01P 3/16
  See application file for complete search history.

(56) References Cited

U.S. PATENT DOCUMENTS

| | | | |
|---|---|---|---|
| 5,225,797 A | 7/1993 | Schary et al. | |
| 5,559,480 A | 9/1996 | Ivanivsky | |
| 5,754,948 A | 5/1998 | Metze | |
| 6,023,211 A * | 2/2000 | Somei | H01P 3/081 174/262 |
| 6,175,287 B1 * | 1/2001 | Lampen et al. | 333/247 |
| 6,265,950 B1 * | 7/2001 | Schmidt et al. | 333/26 |
| 6,268,781 B1 * | 7/2001 | Schaffner | 333/26 |
| 6,967,347 B2 * | 11/2005 | Estes et al. | 257/25 |
| 7,330,702 B2 | 2/2008 | Chen et al. | |
| 7,379,713 B2 | 5/2008 | Lindstedt | |
| 7,382,212 B2 * | 6/2008 | Lo Hine Tong et al. | 333/26 |
| 7,453,143 B2 * | 11/2008 | Dutta | 257/700 |
| 7,471,175 B2 * | 12/2008 | Voss | 333/247 |
| 7,489,839 B2 | 2/2009 | Kim et al. | |
| 7,576,629 B2 * | 8/2009 | Nagamatsu et al. | 333/247 |
| 7,768,457 B2 * | 8/2010 | Pettus et al. | 343/700 MS |
| 8,213,476 B1 * | 7/2012 | Wanke et al. | 372/45.012 |
| 8,615,150 B2 * | 12/2013 | Chowdhury et al. | 385/122 |
| 8,669,834 B2 * | 3/2014 | Cheng et al. | 333/239 |
| 2003/0076188 A1 | 4/2003 | Dawn et al. | |
| 2004/0173880 A1 * | 9/2004 | Achyut | 257/664 |
| 2005/0220386 A1 * | 10/2005 | Nakada et al. | 385/1 |
| 2005/0237137 A1 * | 10/2005 | Dutta | 333/246 |
| 2006/0165360 A1 | 7/2006 | Siegel et al. | |
| 2007/0262836 A1 * | 11/2007 | Voss | 333/247 |
| 2008/0118200 A1 * | 5/2008 | Kim et al. | 385/14 |
| 2009/0009408 A1 | 1/2009 | Rofougaran | |
| 2009/0057872 A1 | 3/2009 | Ehlers | |
| 2009/0072930 A1 * | 3/2009 | Dutta | 333/238 |
| 2010/0135626 A1 * | 6/2010 | Sun et al. | 385/123 |
| 2010/0316335 A1 * | 12/2010 | Furuyama | 385/88 |
| 2011/0018657 A1 * | 1/2011 | Cheng et al. | 333/239 |
| 2011/0050371 A1 * | 3/2011 | Deal et al. | 333/239 |
| 2012/0031644 A1 * | 2/2012 | Maxwell et al. | 174/126.1 |
| 2012/0032080 A1 * | 2/2012 | Koyama et al. | 250/339.07 |
| 2012/0043107 A1 * | 2/2012 | Nair | 174/103 |
| 2012/0068890 A1 | 3/2012 | Haroun et al. | |
| 2012/0068891 A1 | 3/2012 | Haroun et al. | |
| 2012/0306598 A1 * | 12/2012 | Izadian | 333/239 |
| 2013/0063159 A1 * | 3/2013 | Koyama | 324/639 |
| 2013/0154759 A1 * | 6/2013 | Morita et al. | 333/26 |
| 2013/0265732 A1 * | 10/2013 | Herbsommer et al. | |
| 2013/0265733 A1 | 10/2013 | Herbsommer et al. | |
| 2013/0265734 A1 * | 10/2013 | Herbsommer et al. | 361/783 |
| 2014/0055216 A1 * | 2/2014 | Xue et al. | 333/239 |

* cited by examiner

DIELECTRIC WAVEGUIDE CORE BETWEEN GROUND PLANES SECURED IN A CHANNEL

This application is a Divisional of prior application Ser. No. 13/439,557, filed Apr. 4, 2012, now U.S. Pat. No. 9,405,064, issued Aug. 2, 2016.

TECHNICAL FIELD

The invention relates generally to chip-to-chip communications and, more particularly, to chip-to-chip communications using a dielectric waveguide.

BACKGROUND

The most widely used interconnect system (which is employed in most electronic devices) employs metal traces that are integrated into a printed circuit board (PCB) or backplane. For this type of system, integrated circuits (ICs) are secured to the PCB so as to be electrically coupled to one or more of the traces, allowing for interchip or chip-to-chip communications. A problem with this arrangement is that the physical limit for data rates or data transmission is being reached, so, as a result, several different types of communications links have been or are being developed: optical and wireless links. Each of these developing technologies employs the use of a transmission medium, namely an optical fiber for optical links and a metal waveguide for wireless links.

Turning to FIGS. 1 and 2, an example of an interconnect system 100 using a wireless link or optical link can be seen. In this example, a transmission medium 104 (which is a metal waveguide or an optical fiber) is integrated into a PCB 102. ICs 106-1 and 102-6 are secured to the PCB 102 and located in proximity to each respective end of the transmission medium 104. Theoretically, then, the transceiver 108-1 and 108-2 (which are optical transceivers for optical links and radio frequency (RF) transceivers for wireless links) can allow for interchip communication between ICs 106-1 and 106-2. In practice, however, this interchip communication is not a simple task. Assuming, for example, that the system 100 employs an optical link, the optical transceivers 108-1 and 108-2 would have an on-die light emitting diode (LED) and/or photodiode (which is difficult with current process technologies), having an optical axis. Usually, the LED (for transmission) is a laser diode, which has a particular wavelength or frequency, and the transmission medium 104 (optical fiber for this example) is dimensioned to accommodate the wavelength of the light emitted from LED. Typically, the transmission medium 104 (optical fiber for this example) is a monomode fiber to improve bandwidth, which has a diameter that is related to the wavelength of the light emitted from LED. For example, for near infrared (i.e., wavelength between about 0.7 µm and about 3 µm), a monomode optical fiber will generally have a diameter between about 8 µm and about 10 µm. Thus, a misalignment (of even a few microns) between the optical axis of the transmission medium 104 (optical fiber for this example) and the optical axis of the LED (or photodiode) may result is a poor interconnect or no interconnect. Therefore, precision machining or other more exotic micro-optical structures would generally be necessary. The same would also be true for metal waveguides; namely, precision machining would generally be necessary for proper alignment. Metallic waveguides for sub-millimeter waves are also quite lossy, substantially limiting the distance over which the waveguides would work.

Therefore, there is a need for an improved interconnect system.

Some other examples of conventional systems are: U.S. Pat. Nos. 5,754,948; 7,768,457; 7,379,713; 7,330,702; 6,967,347; and U.S. Patent Pre-Grant Publ. No. 2009/0009408.

SUMMARY

An embodiment of the present invention, accordingly, provides an apparatus. The apparatus comprises a circuit board having a first side, a second side, and a first ground plane, wherein the first ground plane is formed on the first side of the circuit board; a package substrate that is secured to the first side of the circuit board, wherein the package substrate includes: a second ground plane that is electrically coupled to the first ground plane; a microstrip line that is substantially parallel to the first and second ground planes, wherein the microstrip line has: a first portion that overlays at least a portion of the second ground plane and that is separated from the second ground plane by a first distance, wherein the first portion of the microstrip line is dimensioned to have an impedance to propagate radiation having a wavelength; and a second portion that overlays at least a portion of the first ground plane and that is separated from the first ground plane by a second distance, wherein the second distance is greater than the first distance, and wherein the second portion of the microstrip line is dimensioned to have the impedance to propagate the radiation having the wavelength, and wherein the second portion of the microstrip line is located within a transition region; an integrated circuit (IC) that is secured to the package substrate and that is electrically coupled to the first portion of the microstrip line; and a dielectric waveguide that is secured to the circuit board, wherein the dielectric waveguide includes a core that overlies at least a portion of the first ground plane and extends into the transition region.

In accordance with an embodiment of the present invention, the wavelength is less than or equal to about 1 mm.

In accordance with an embodiment of the present invention, the dielectric waveguide further comprises a cladding, and wherein the core has first dielectric constant, and wherein the cladding has a second dielectric constant, and wherein the first dielectric constant is greater than the second dielectric constant.

In accordance with an embodiment of the present invention, the package substrate has first and second sides, and wherein the microstrip line is formed on the first side of the package substrate, and wherein the IC is secured to the first side of the package substrate, and wherein the first ground plane is formed on the second side of the package substrate.

In accordance with an embodiment of the present invention, at least one solder ball is secured to the first and second ground planes.

In accordance with an embodiment of the present invention, the impedance is about 50Ω.

In accordance with an embodiment of the present invention, the first portion of the microstrip line is generally rectangular having a width of about 25 µm, and wherein the second portion of the microstrip line is generally rectangular having a width of about 50 µm.

In accordance with an embodiment of the present invention, an apparatus is provided. The apparatus comprises a circuit board having a first side, a second sides, and a plurality of circuit board ground planes, wherein each circuit board ground plane is formed on the first side of the circuit board; a plurality of package substrates, wherein each package substrate is secured to the first side of the circuit board, and wherein each is collocated with at least one of the circuit board ground planes, wherein each package substrate includes: a package substrate ground plane that is electrically coupled to its circuit board ground plane; a microstrip line that is substantially parallel to its package substrate ground plane and its circuit board ground plane, wherein the microstrip line has: a first portion that overlays at least a portion of its package substrate ground plane and that is separated from its package substrate ground plane by a first distance, wherein the first portion of the microstrip line is dimensioned to have an impedance to propagate radiation having a wavelength; and a second portion that overlays at least a portion of its circuit board ground plane and that is separated from its circuit board ground plane by a second distance, wherein the second distance is greater than the first distance, and wherein the second portion of the microstrip line is dimensioned to have the impedance to propagate the radiation having the wavelength, and wherein the second portion of the microstrip line is located within a transition region; a plurality of ICs, wherein each IC is secured to at least one of the package substrates and is electrically coupled to the first portion of its microstrip line; and a dielectric waveguide network that is secured to the circuit board, wherein a core from dielectric waveguide network the overlies at least a portion of each circuit board ground plane and extends into its transition region.

In accordance with an embodiment of the present invention, the dielectric waveguide network further a plurality of dielectric waveguides having a cladding, and wherein the core has first dielectric constant, and wherein the cladding has a second dielectric constant, and wherein the first dielectric constant is greater than the second dielectric constant.

In accordance with an embodiment of the present invention, each package substrate has first and second sides, and wherein the microstrip line is formed on the first side of the package substrate, and wherein the IC is secured to the first side of the package substrate, and wherein the package substrate ground plane is formed on the second side of the package substrate.

In accordance with an embodiment of the present invention, at least one solder ball is secured to the circuit board ground plane and the package substrate ground planes for each package substrate.

In accordance with an embodiment of the present invention, an apparatus is provided. The apparatus comprises a circuit board having a first side, a second sides, a first ground plane, and a second ground plane, wherein the first and second ground planes are formed on the first side of the circuit board, and wherein the first and second ground planes are separated from one another; a first package substrate that is secured to the first side of the circuit board, wherein the first package substrate includes: a third ground plane that is electrically coupled to the first ground plane; a first microstrip line that is substantially parallel to the first and third ground planes, wherein the first microstrip line has: a first portion that overlays at least a portion of the third ground plane and that is separated from the third ground plane by a first distance, wherein the first portion of the first microstrip line is dimensioned to have an impedance to propagate radiation having a wavelength; and a second portion that overlays at least a portion of the first ground plane and that is separated from the first ground plane by a second distance, wherein the second distance is greater than the first distance, and wherein the second portion of the first microstrip line is dimensioned to have the impedance to propagate the radiation having the wavelength, and wherein the second portion of the first microstrip line is located within a first transition region; a first IC that is secured to the package substrate and that is electrically coupled to the first portion of the first microstrip line; a second package substrate that is secured to the first side of the circuit board, wherein the second package substrate includes: a fourth ground plane that is electrically coupled to the second ground plane; a second microstrip line that is substantially parallel to the second and fourth ground planes, wherein the second microstrip line has: a first portion that overlays at least a portion of the fourth ground plane and that is separated from the fourth ground plane by a third distance, wherein the first portion of the second microstrip line is dimensioned to have the impedance to propagate the radiation having the wavelength; and a second portion that overlays at least a portion of the second ground plane and that is separated from the second ground plane by a fourth distance, wherein the fourth distance is greater than the third distance, and wherein the second portion of the second microstrip line is dimensioned to have the impedance to propagate the radiation having the wavelength, and wherein the second portion of the second microstrip line is located within a second transition region; a second IC that is secured to the package substrate and that is electrically coupled to the first portion of the second microstrip line; and a dielectric waveguide having: a core with first and second ends, wherein the core is secured to the circuit board and overlies at least a portion of the first and second ground planes, and wherein the first end of the core extends into the first transition region, and wherein the second end of the core extends into the second transition region, and wherein the core has a first dielectric constant; and a cladding that is secured to the core, wherein the cladding has a second dielectric constant, and wherein the first dielectric constant is greater than the second dielectric constant.

In accordance with an embodiment of the present invention, each of the first and second package substrates has first and second sides, and wherein its microstrip line is formed on the first side of the package substrate, and wherein its IC is secured to the first side of the package substrate, and wherein its first ground plane is formed on the second side of the package substrate.

In accordance with an embodiment of the present invention, at least one solder ball is secured to the first and third ground planes, and at least one solder ball is secured to the second and fourth ground planes.

In accordance with an embodiment of the present invention, the first portion of each of the first and second microstrip lines is generally rectangular, and wherein the second portion of each of the first and second microstrip lines is generally rectangular.

In accordance with an embodiment of the present invention, an apparatus is provided. The apparatus comprises a circuit board having a first side, a second sides, and a first ground plane; a channel formed in the first side of circuit board, wherein the first ground plane underlies a least a portion of the channel; a package substrate that is secured to the first side of the circuit board, wherein the package substrate includes: a second ground plane that is electrically coupled to the first ground plane; a microstrip line that is substantially parallel to the first and second ground planes, wherein the microstrip line has: a first portion that overlays at least a portion of the second ground plane and that is separated from the second ground plane by a first distance, wherein the first portion of the microstrip line is dimensioned to have an impedance to propagate radiation having a wavelength; and a second portion that overlays at least a portion of the first ground plane and that is separated from the first ground plane by a second distance, wherein the second distance is greater than the first distance, and wherein the second portion of the microstrip line is dimensioned to have the impedance to propagate the radiation having the wavelength, and wherein the second portion of the microstrip line is located within a transition region; an integrated circuit (IC) that is secured to the package substrate and that is electrically coupled to the first portion of the microstrip line; and a dielectric core that overlies at least a portion of the first ground plane, that extends into the transition region, and that is secured in the channel.

In accordance with an embodiment of the present invention, the apparatus further comprises a cladding, and wherein the core has first dielectric constant, and wherein the cladding has a second dielectric constant, and wherein the first dielectric constant is greater than the second dielectric constant.

In accordance with an embodiment of the present invention, the circuit board further comprises a via that extends from the first ground plane to the first side of the circuit board, and wherein at least one solder ball is secured to the second ground plane and the via.

In accordance with an embodiment of the present invention, the first portion of the microstrip line is generally rectangular.

In accordance with an embodiment of the present invention, an apparatus is provided. The apparatus comprises a circuit board having a first side, a second sides, and a plurality of circuit board ground planes; a channel network formed in the first side of circuit board, wherein each circuit board ground plane underlies a least a portion of the channel network; a plurality of package substrates, wherein each package substrate is secured to the first side of the circuit board, and wherein each is collocated with at least one of the circuit board ground planes, wherein each package substrate includes: a package substrate ground plane that is electrically coupled to its circuit board ground plane; a microstrip line that is substantially parallel to its package substrate ground plane and its circuit board ground plane, wherein the microstrip line has: a first portion that overlays at least a portion of its package substrate ground plane and that is separated from its package substrate ground plane by a first distance, wherein the first portion of the microstrip line is dimensioned to have an impedance to propagate radiation having a wavelength; and a second portion that overlays at least a portion of its circuit board ground plane and that is separated from its circuit board ground plane by a second distance, wherein the second distance is greater than the first distance, and wherein the second portion of the microstrip line is dimensioned to have the impedance to propagate the radiation having the wavelength, and wherein the second portion of the microstrip line is located within a transition region; a plurality of ICs, wherein each IC is secured to at least one of the package substrates and is electrically coupled to the first portion of its microstrip line; and a dielectric core network that is secured in the channel network and that has a plurality of ends, wherein each end from dielectric waveguide network the overlies at least a portion of at least one of the circuit board ground planes and extends into its transition region.

In accordance with an embodiment of the present invention, the dielectric waveguide network further a plurality of dielectric waveguides having a cladding, and wherein the core has first dielectric constant, and wherein the cladding has a second dielectric constant, and wherein the first dielectric constant is greater than the second dielectric constant.

In accordance with an embodiment of the present invention, the circuit board further comprises a plurality of vias, wherein each via extends between the first side of the circuit board and at least one of the circuit board ground planes, and wherein at least one solder ball is secured to at least one via and at least one package substrate ground plane.

In accordance with an embodiment of the present invention, an apparatus is provided. The apparatus comprises a circuit board having a first side, a second sides, a first ground plane, and a second ground plane; a channel formed in the first side of the circuit board and having a first end and a second send, wherein the first end of the channel overlies at least a portion of the first ground plane, and wherein the second end of the channel overlies at least a portion of the second ground plane; a first package substrate that is secured to the first side of the circuit board, wherein the first package substrate includes: a third ground plane that is electrically coupled to the first ground plane; a first microstrip line that is substantially parallel to the first and third ground planes, wherein the first microstrip line has: a first portion that overlays at least a portion of the third ground plane and that is separated from the third ground plane by a first distance, wherein the first portion of the first microstrip line is dimensioned to have an impedance to propagate radiation having a wavelength; and a second portion that overlays at least a portion of the first ground plane and that is separated from the first ground plane by a second distance, wherein the second distance is greater than the first distance, and wherein the second portion of the first microstrip line is dimensioned to have the impedance to propagate the radiation having the wavelength, and wherein the second portion of the first microstrip line is located within a first transition region; a first IC that is secured to the package substrate and that is electrically coupled to the first portion of the first microstrip line; a second package substrate that is secured to the first side of the circuit board, wherein the second package substrate includes: a fourth ground plane that is electrically coupled to the second ground plane; a second microstrip line that is substantially parallel to the second and fourth ground planes, wherein the second microstrip line has: a first portion that overlays at least a portion of the fourth ground plane and that is separated from the fourth ground plane by a third distance, wherein the first portion of the second microstrip line is dimensioned to have the impedance to propagate the radiation having the wavelength; and a second portion that overlays at least a portion of the second ground plane and that is separated from the second ground plane by a fourth distance, wherein the fourth distance is greater than the third distance, and wherein the second portion of the second microstrip line is dimensioned to have the impedance to propagate the radiation having the wavelength, and wherein the second portion of the second microstrip line is located within a second transition region; a second IC that is secured to the package substrate and that is electrically coupled to the first portion of the second microstrip line; and a dielectric core with first and second ends, wherein the core is secured to in the channel, and wherein the first end of the dielectric core overlies at least a portion of the first ground plane, and wherein the send end of the dielectric core overlies at least a portion of the second ground plane, and wherein the first end of the core extends into the first transition region, and wherein the second end of the core extends into the second transition region, and wherein the dielectric core has dielectric constant that is greater than the dielectric constant of the circuit board.

In accordance with an embodiment of the present invention, an apparatus is provided. The apparatus comprises a circuit board having a first side, a second sides, a first ground plane, and a first microstrip line, wherein the first microstrip line is generally parallel to the first ground plane; a channel formed in the first side of circuit board, wherein the first ground plane underlies a least a portion of the channel; a package substrate that is secured to the first side of the circuit board, wherein the package substrate includes: a second ground plane that is electrically coupled to the first ground plane; a second microstrip line that is substantially parallel to the first and second ground planes, wherein the second microstrip line has: a first portion that overlays at least a portion of the second ground plane and that is separated from the second ground plane by a first distance, wherein the first portion of the second microstrip line is dimensioned to have an impedance to propagate radiation having a wavelength; and a second portion that overlays at least a portion of the first ground plane and that is separated from the first ground plane by a second distance, wherein the second distance is greater than the first distance, and wherein the second portion of the second microstrip line is dimensioned to have the impedance to propagate the radiation having the wavelength, and wherein the second portion of the microstrip line is located within a transition region, and wherein the second portion of the second microstrip line is electrically coupled to the first microstrip line; an integrated circuit (IC) that is secured to the package substrate and that is electrically coupled to the first portion of the second microstrip line; a metal waveguide that is secured in the channel, that is located in the transition region, and that is electrically coupled to the first microstrip line; and a dielectric core that overlies at least a portion of the first ground plane, that extends into the metal waveguide, and that is secured in the channel.

In accordance with an embodiment of the present invention, the package substrate has first and second sides, and wherein the second microstrip line is formed on the first side of the package substrate, and wherein the IC is secured to the first side of the package substrate, and wherein the first ground plane is formed on the second side of the package substrate, and wherein the package substrate further comprises a via that extends from the second portion of the second microstrip line to the second side of the package substrate, and wherein at least one solder ball is secured to the via and the first microstrip line.

In accordance with an embodiment of the present invention, the via further comprises a first via, and wherein the circuit board further comprises a second via that extends from the first ground plane to the first side of the circuit board, and wherein at least one solder ball is secured to the second ground plane and the second via.

In accordance with an embodiment of the present invention, the metal waveguide further comprises: a first plate that is coplanar with and electrically coupled to the first microstrip line; a second plate that is coplanar with and electrically coupled to the first plate; and a plurality of waveguide vias that extend between the second plate and the first ground plane.

In accordance with an embodiment of the present invention, an apparatus is provided. The apparatus comprises a circuit board having a first side, second sides, a plurality of circuit board ground planes, and a plurality of circuit board microstrip lines; a channel network formed in the first side of circuit board, wherein each circuit board ground plane underlies a least a portion of the channel network; a plurality of package substrates, wherein each package substrate is secured to the first side of the circuit board, and wherein each is collocated with at least one of the circuit board ground planes and at least one of the circuit board microstrip lines, wherein each package substrate includes: a package substrate ground plane that is electrically coupled to its circuit board ground plane; a package substrate microstrip line that is substantially parallel to its package substrate ground plane and its circuit board ground plane, wherein the package substrate microstrip line has: a first portion that overlays at least a portion of its package substrate ground plane and that is separated from its package substrate ground plane by a first distance, wherein the first portion of the package substrate microstrip line is dimensioned to have an impedance to propagate radiation having a wavelength; and a second portion that overlays at least a portion of its circuit board ground plane and that is separated from its circuit board ground plane by a second distance, wherein the second distance is greater than the first distance, and wherein the second portion of the package substrate microstrip line is dimensioned to have the impedance to propagate the radiation having the wavelength, and wherein the second portion of the package substrate microstrip line is located within a transition region; a plurality of ICs, wherein each IC is secured to at least one of the package substrates and is electrically coupled to the first portion of its microstrip line; a plurality of metal waveguides, wherein each metal waveguide is secured in the channel network, that is located in the transition region for at least one of the package substrates, and that is electrically coupled to at least one of the circuit board microstrip lines; and a dielectric core network that is secured in the channel network and that has a plurality of ends, wherein each end from dielectric waveguide network the overlies at least a portion of at least one of the circuit board ground planes and extends into its metal waveguide.

In accordance with an embodiment of the present invention, the dielectric waveguide network further a plurality of dielectric waveguides having a cladding, and wherein the core has first dielectric constant, and wherein the cladding has a second dielectric constant, and wherein the first dielectric constant is greater than the second dielectric constant.

In accordance with an embodiment of the present invention, each package substrate has first and second sides, and wherein the microstrip line is formed on the first side of the package substrate, and wherein the IC is secured to the first side of the package substrate, and wherein the package substrate ground plane is formed on the second side of the package substrate, and wherein each package substrate further comprises a package substrate via that extends from the second portion of its package substrate microstrip line to the second side of its package substrate, and wherein at least one solder ball is secured to the package substrate via and its circuit board microstrip line.

In accordance with an embodiment of the present invention, an apparatus is provided. The apparatus comprises a circuit board having a first side, second sides, a first ground plane, a second ground plane, a first microstrip line, and a second microstrip line, wherein the first and second microstrip lines are formed on the first side of the circuit board, and wherein the first microstrip line is collocated with and generally parallel to the first ground plane, and wherein second microstrip line is collocated with and generally parallel to the second ground plane; a channel formed in the first side of the circuit board and having a first end and a second send, wherein the first end of the channel overlies at least a portion of the first ground plane, and wherein the second end of the channel overlies at least a portion of the second ground plane; a first package substrate that is secured to the first side of the circuit board, wherein the first package substrate includes: a third ground plane that is electrically coupled to the first ground plane; a third microstrip line that is substantially parallel to the first and third ground planes, wherein the third microstrip line has: a first portion that overlays at least a portion of the third ground plane and that is separated from the third ground plane by a first distance, wherein the first portion of the third microstrip line is dimensioned to have an impedance to propagate radiation having a wavelength; and a second portion that overlays at least a portion of the first ground plane and that is separated from the first ground plane by a second distance, wherein the second distance is greater than the first distance, and wherein the second portion of the third microstrip line is dimensioned to have the impedance to propagate the radiation having the wavelength, and wherein the second portion of the third microstrip line is located within a first transition region; a first IC that is secured to the package substrate and that is electrically coupled to the first portion of the third microstrip line; a second package substrate that is secured to the first side of the circuit board, wherein the second package substrate includes: a fourth ground plane that is electrically coupled to the second ground plane; a fourth microstrip line that is substantially parallel to the second and fourth ground planes, wherein the fourth microstrip line has: a first portion that overlays at least a portion of the fourth ground plane and that is separated from the fourth ground plane by a third distance, wherein the first portion of the fourth microstrip line is dimensioned to have the impedance to propagate the radiation having the wavelength; and a second portion that overlays at least a portion of the second ground plane and that is separated from the second ground plane by a fourth distance, wherein the fourth distance is greater than the third distance, and wherein the second portion of the fourth microstrip line is dimensioned to have the impedance to propagate the radiation having the wavelength, and wherein the second portion of the second microstrip line is located within a second transition region; a second IC that is secured to the package substrate and that is electrically coupled to the first portion of the fourth microstrip line; a first metal waveguide that is secured in the channel, that is located in the first transition region, and that is electrically coupled to the first microstrip line; a second metal waveguide that is secured in the channel, that is located in the second transition region, and that is electrically coupled to the second microstrip line; a dielectric core with first and second ends, wherein the core is secured to in the channel, and wherein the first end of the dielectric core overlies at least a portion of the first ground plane, and wherein the send end of the dielectric core overlies at least a portion of the second ground plane, and wherein the first end of the core extends into the first metal waveguide, and wherein the second end of the core extends into the second metal waveguide, and wherein the dielectric core has dielectric constant that is greater than the dielectric constant of the circuit board.

In accordance with an embodiment of the present invention, the package substrate has first and second sides, and wherein the microstrip line is formed on the first side of the package substrate, and wherein the IC is secured to the first side of the package substrate, and wherein the first ground plane is formed on the second side of the package substrate, and wherein the first package substrate further comprises a first via that extends from the second portion of third substrate microstrip line to the second side of the first package substrate, and wherein at least one solder ball is secured to the first via and the first microstrip line, and wherein the second package substrate further comprises a second via that extends from the second portion of fourth substrate microstrip line to the second side of the second package substrate, and wherein at least one solder ball is secured to the second via and the second microstrip line.

In accordance with an embodiment of the present invention, each of the first and second metal waveguides further comprises: a first plate that is coplanar with and electrically coupled to its microstrip line; a second plate that is coplanar with and electrically coupled to the first plate; and a plurality of waveguide vias that extend between the second plate and its circuit board ground plane.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
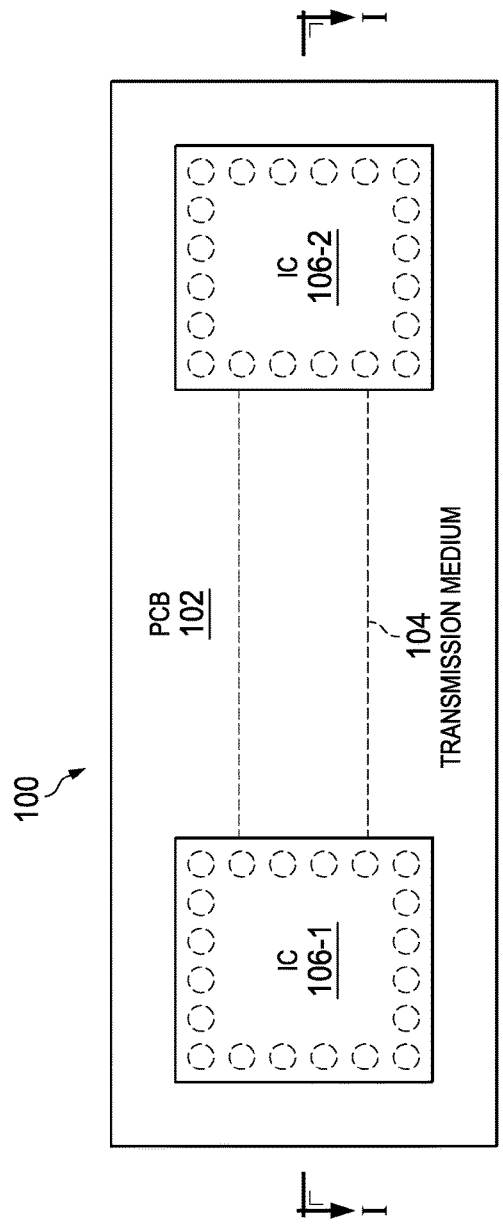
FIG. 1 is a diagram of an example of a conventional interconnect system.
Figure 2:
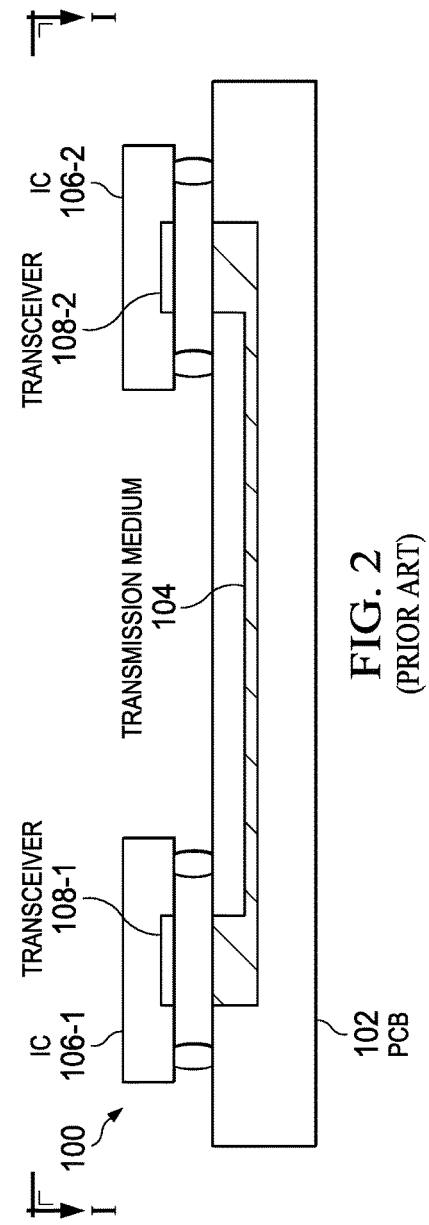
FIG. 2 is a cross-sectional view of the interconnect system of FIG. 1 along section line I-I.
Figure 3:
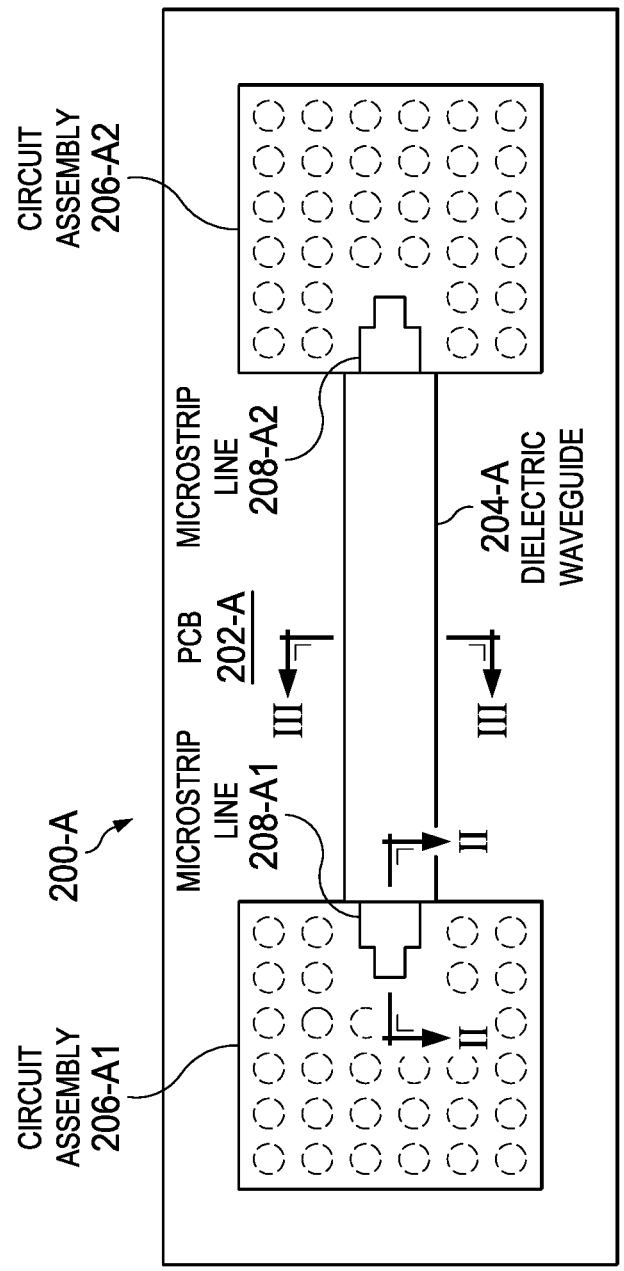
FIG. 3 is a diagram of an example of an interconnect system in accordance with the present invention.
Figure 4:
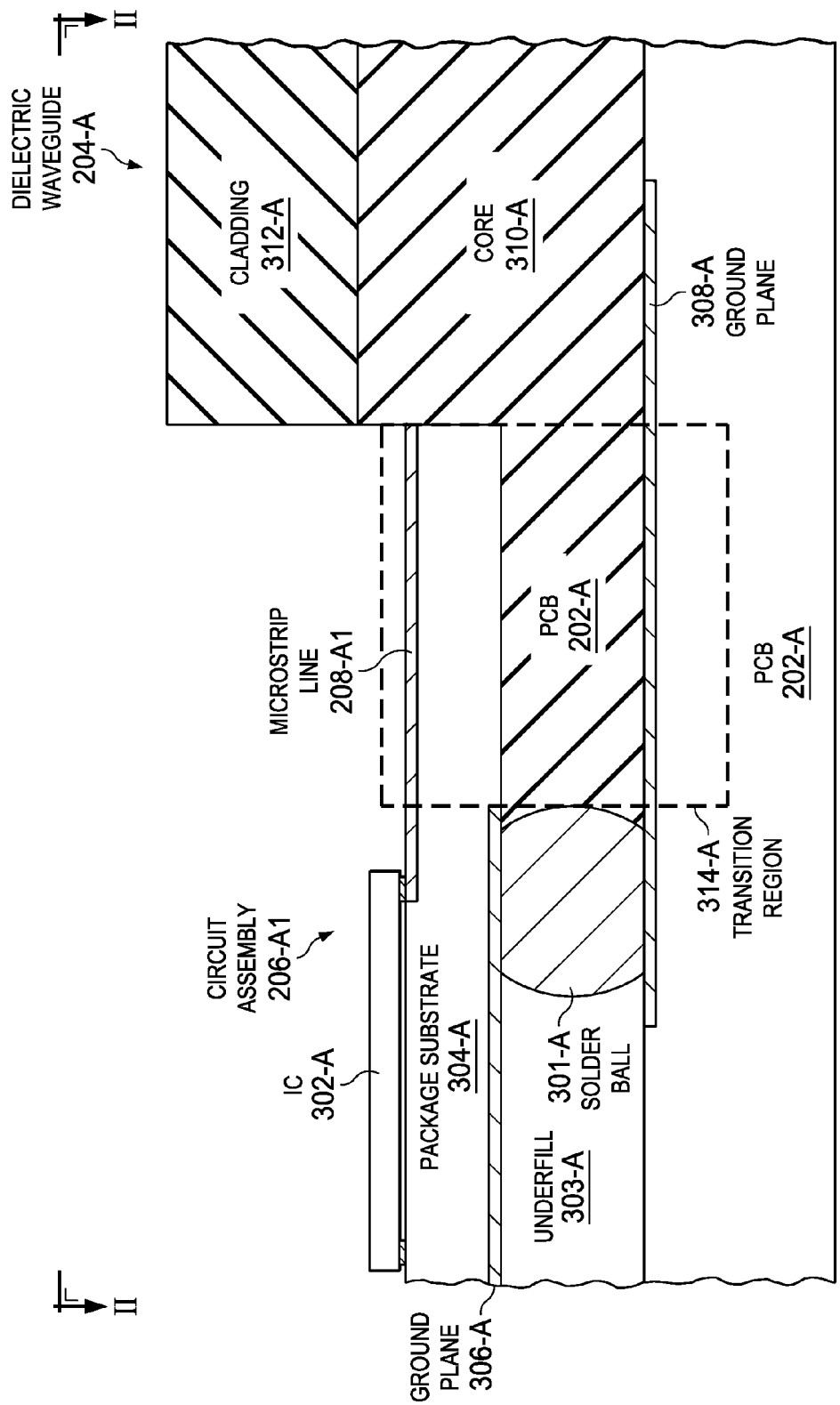
FIGS. 4 and 6 are example cross-sectional views of the interconnect system of FIG. 3 along section lines II-II and III-III, respectively.

Refer now to the drawings wherein depicted elements are, for the sake of clarity, not necessarily shown to scale and wherein like or similar elements are designated by the same reference numeral through the several views.

Turning to FIGS. 3-6, an example of an interconnect system 200-A in accordance with the present invention can be seen. In this example system 200-A, circuit assemblies 206-A1 and 206-A2 are able to communication with one another through a dielectric waveguide 204-A that is secured (i.e., glued) to the PCB 202-A. The circuit assemblies 206-1 and 206-2 can be formed of a IC 302-A that is secured to a package substrate 304-A (which can for example be a PCB) through a ball grid array (BGA) or solder balls (which are shown in broken lines). The package substrate 304-A can then be secured to the PCB 202-A with a BGA or solder balls (i.e., solder ball 301-A), allowing for the IC 302-A to be electrically coupled to at least one solder ball. An underfill layer 303-A may also be included between the package substrate 304-A and PCB 202-A to provide additional mechanical support for the circuit assemblies 206-1 and 206-2. The package substrate 304-A and the PCB 202-A can be separated, for example, by about 0.25 mm. Other examples of dielectric waveguide systems can be found in co-pending U.S. patent application Ser. No. 12/887,270, entitled "HIGH SPEED DIGITAL INTERCONNECT AND METHOD," filed on Sep. 21, 2010, and co-pending U.S. patent application Ser. No. 12/887,323, entitled "CHIP TO DIELECTRIC WAVEGUIDE INTERFACE FOR SUB-MILLIMETER WAVE COMMUNICATIONS LINK," filed on Sep. 21, 2010. Each co-pending application is hereby incorporated by reference for all purposes.

In order to provide the interchip link, the package substrate 304-A and PCB 202-A include an antenna system. The antenna system for this example (which shows circuit assembly 206-A1) generally comprises a microstrip line (which is a conductive layer integrated with the package substrate 304-A), a ground plane 306-A (which is a conductive layer integrated with the package substrate 304-A), and a ground plane 308-A (which is a conductive layer integrated with the package substrate 308-A). The ground plane 308-A, as shown and for example, is coupled to ground plane 306-A through solder ball 301-A (which can allow the ground planes 306-A and 308-A to be electrically coupled together). As shown in this example, the dielectric waveguide 204-A is secured to same side or surface as the circuits assemblies 206-A1 and 206-A2 and extends into transition region 314-A where a portion of the core 310-A is located between the ground plane 308-A and portion of the microstrip line 208-A1. Typically, the microstrip line 208-A1 (which is electrically coupled to the IC 302-A through package substrate 304-A) is dimensioned to transmit sub-millimeter (i.e., wavelengths between about 0.5 mm and about 1 mm or less than about 1 mm) or terahertz radiation (i.e., between about 100 GHz and about 1 THz). For this example, the microstrip line 208-1 has two portions with a boundary at the transition region 314-A to allow for RF or wireless signals to be transmitted to the dielectric waveguide 204-A. One portion of the microstrip line 208-A1 (which is shown as extending from the IC 302-A to the transition region 314-A) is generally parallel to ground plane 306-A1, allowing an electric field to extend between the microstrip line 208-A1 and ground plane 306-A1 in the package substrate 304-A. Because there is a relatively short distance between the microstrip line 208-A1 and ground plane 306-A1, this portion of microstrip line 208-A1 can be narrow to achieve a desired impedance (i.e., about 50Ω). At the transition region, there is a step increase in the separation between the microstrip line 208-A1 and its ground plane (which is the ground plane 308-A). Because of increase, the portion of the microstrip line 208-A1 is wider so as to having a matching impedance (i.e., about 50Ω). This can then allow RF signals to be propagated directly from the circuit assemblies 206-A1 and 206-A2. While the boundary at the transition region 314-A is abrupt, most issues (i.e., reflections) can be compensated for or filtered by use of signal processing (i.e., predistortion) within IC 302-A.

Figure 5:
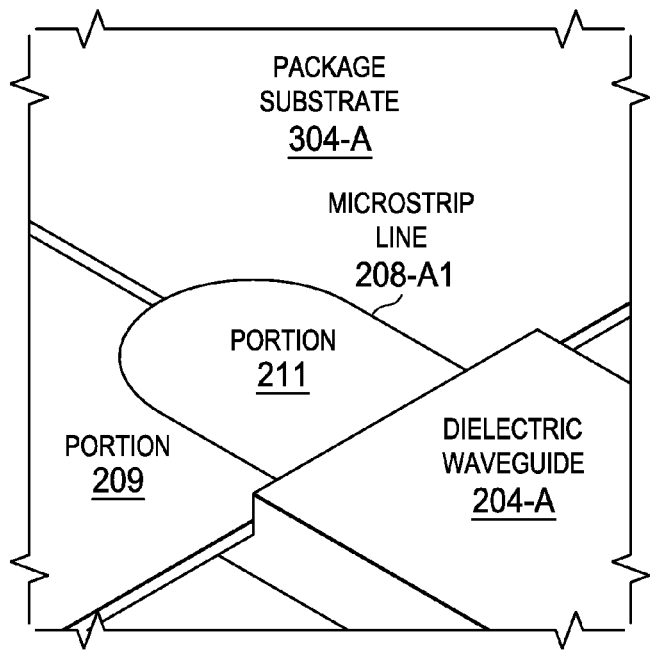
FIG. 5 is an isometric view showing an example arrangement for the microstrip line of FIGS. 3 and 4.
Figure 6:
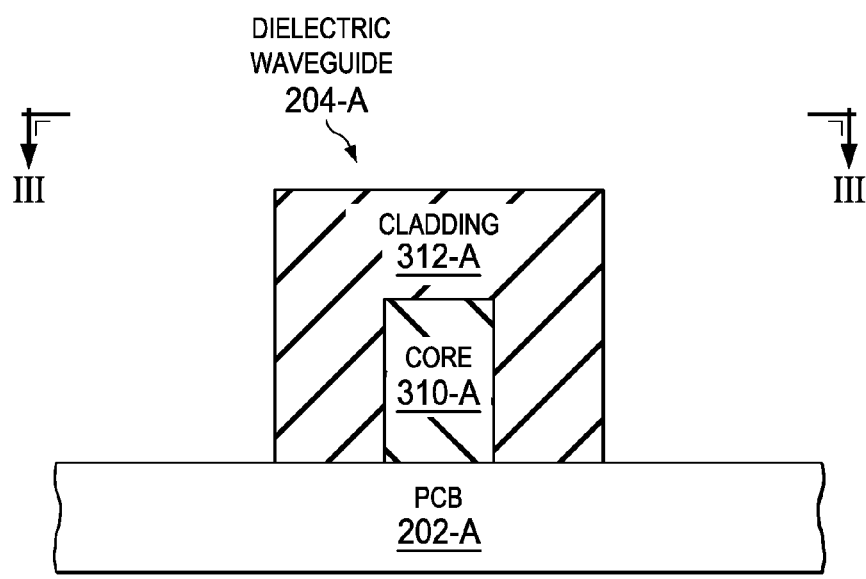

The microstrip line 208-A1 can have other shapes as well. In FIG. 5, an example configuration for the microstrip line 208-A1 can be seen. For this configuration, the microstrip line 208-A1 has two portions 209 and 211. As shown, portion 209 can function as a feed line that is electrically coupled to the IC 302-A, and the portion 211 widens from the width of portion 209. This widening can be can be accomplished by way of a taper, but as shown, the end of portion 211 that is electrically coupled to portion 209 is rounded.

To further improve efficiency, dielectric waveguide 204-A and PCB 202-A can be appropriately configured. Typically and as shown in this example, the core 310-A (which can, for example, be formed of polyamide, polyster, RO3006™ or RO3010™ from Rogers Corporation and can, for example, can have a height of about 0.5 mm) is secured to the PCB 202-A (which can, for example, be formed of RO3003™ from Rogers Corporation) with a cladding 312-A substantially surrounding the remainder the core 310-A. Both the cladding 312-A and PCB 202-A have a lower dielectric constant than the core 310-A, and the cladding 312-A may have the same or similar dielectric constant as the PCB 202-A. This allows the electric field to be confined core 310-A. Additionally, the dielectric waveguide 204-A can be dimensioned to accommodate the wavelength of radiation emitted from the antenna system (i.e., sub-millimeter wavelength).

Figure 9:
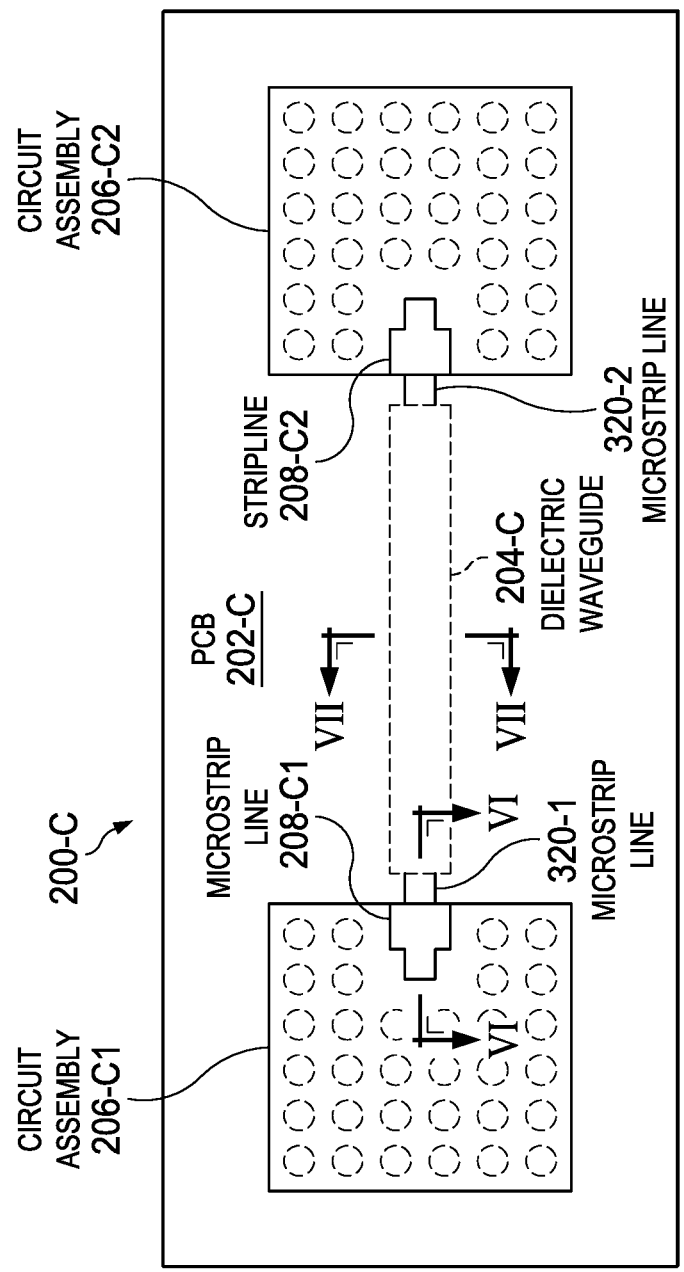
FIG. 9 is a diagram of an example of an interconnect system in accordance with the present invention.
Figure 10:
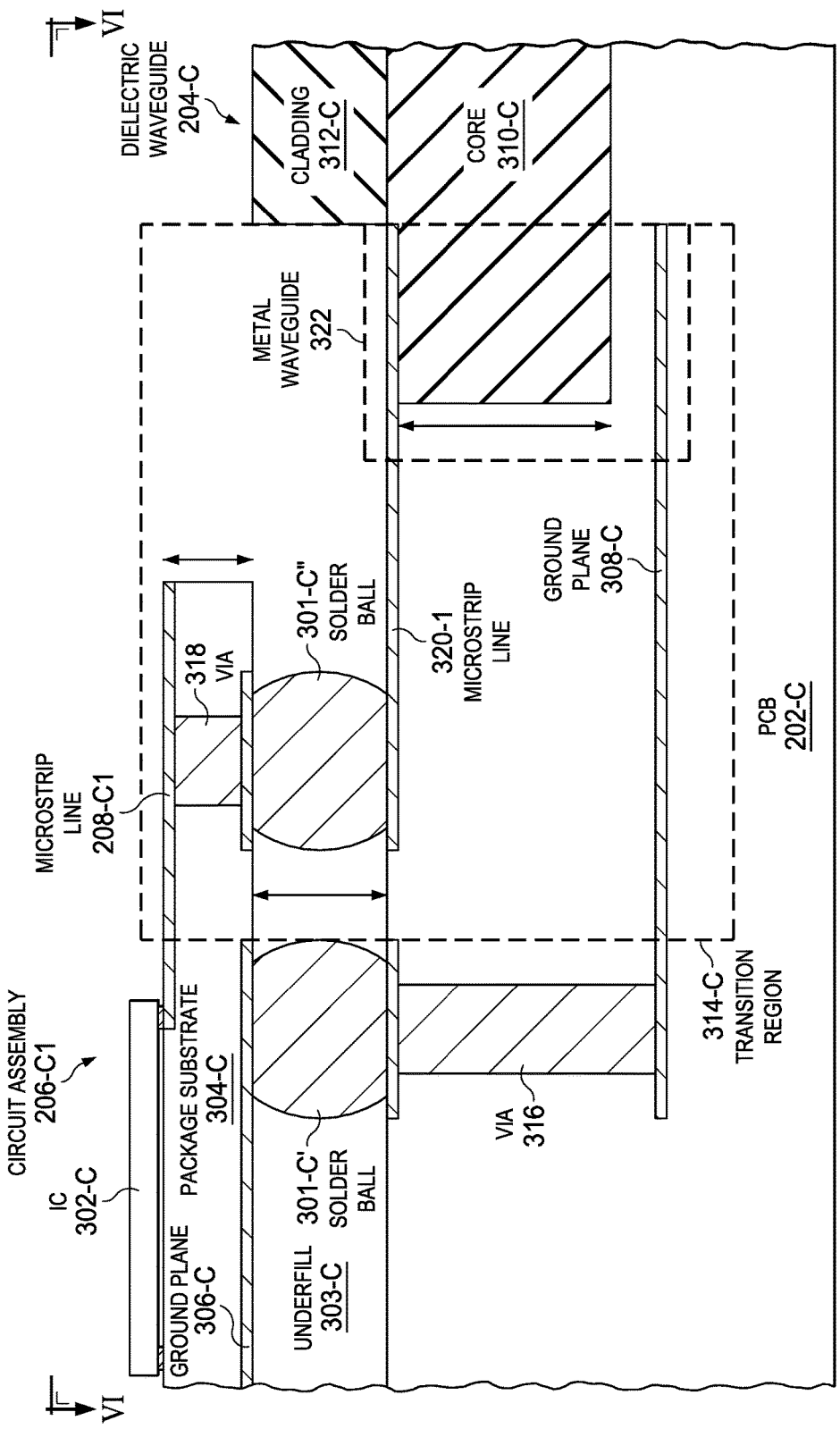
FIG. 10 is an example cross-sectional view of the interconnect system of FIG. 9 along section lines VI-VI.
Figure 11:
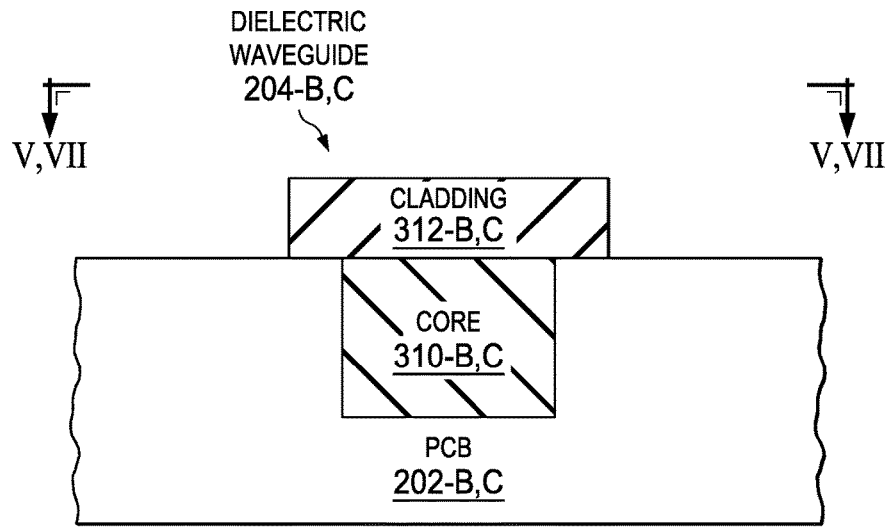
FIG. 11 is an example cross-sectional view of the interconnect system of FIGS. 7 and 9 along section lines V-V and VII-VII, respectively.

Alternatively, as shown in FIGS. 7-12, the dielectric waveguide 312-B,C can be integrated with the elongate circuit board PCB 202-B,C. For these examples, a elongate channel can be routed in PCB 202-B,C, and the dielectric waveguide 204-B,C can be secured to the PCB 202-B,C in the channel. The channel is formed in the circuit board to be open to the top side of the circuit board. The channel has a bottom wall and opposed side walls, and an end portion ending in an end wall. As shown and similar to core 310-A, the cores 310-B,C have end portions that extend into transition regions 314-B,C. The PCB 202-B, C can also be used as the cladding 312-B,C as shown in the example of FIG. 11, but, alternatively, a cladding material may be included in the channel Additionally, the portion of the cladding 312-B,C that extends above (which is shown in broken lines) the PCB 202-B,C can be omitted. The ends of the core 310-B,C that is secured to the channel may also be tapered (as shown, for example, in FIG. 8) or be "squared" (as shown, for example, in FIG. 10). When tapered, the steps may, for example, be incremented in depth by about 5 mils.

Figure 7:
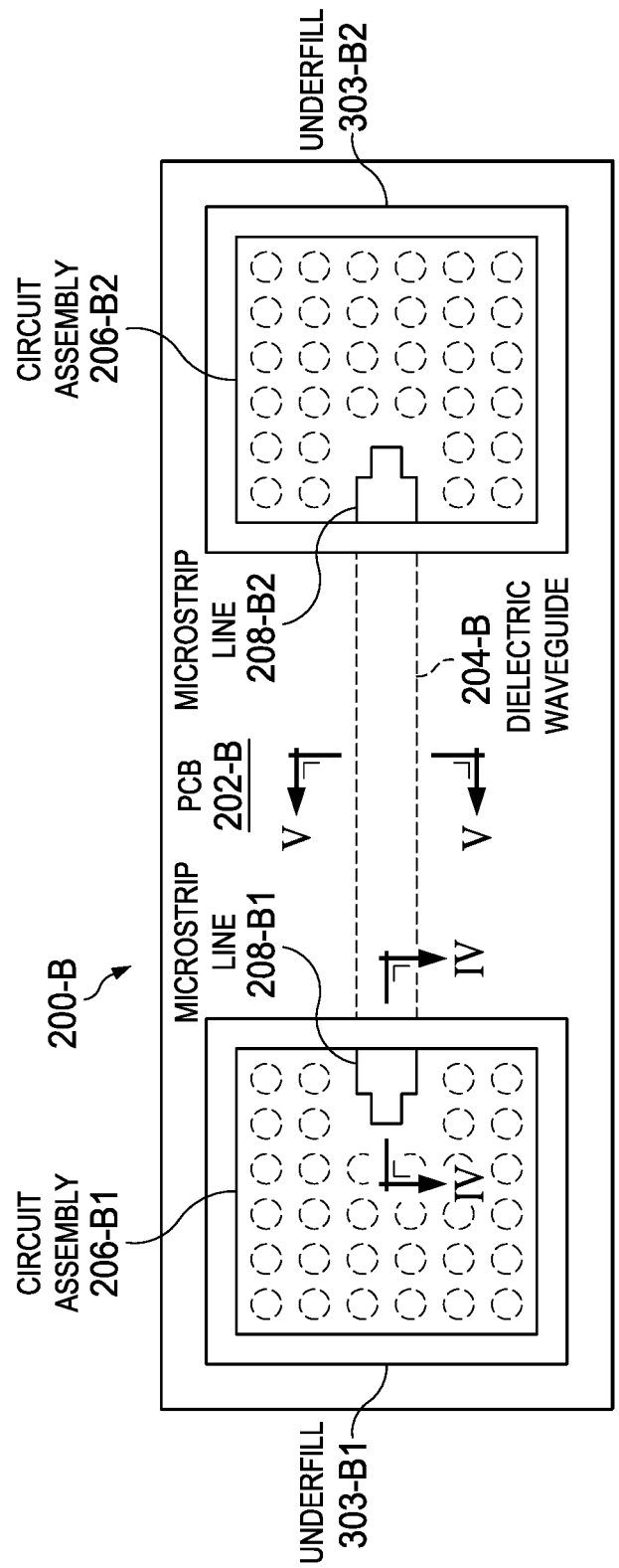
FIG. 7 is a diagram of an example of an interconnect system in accordance with the present invention.
Figure 8:
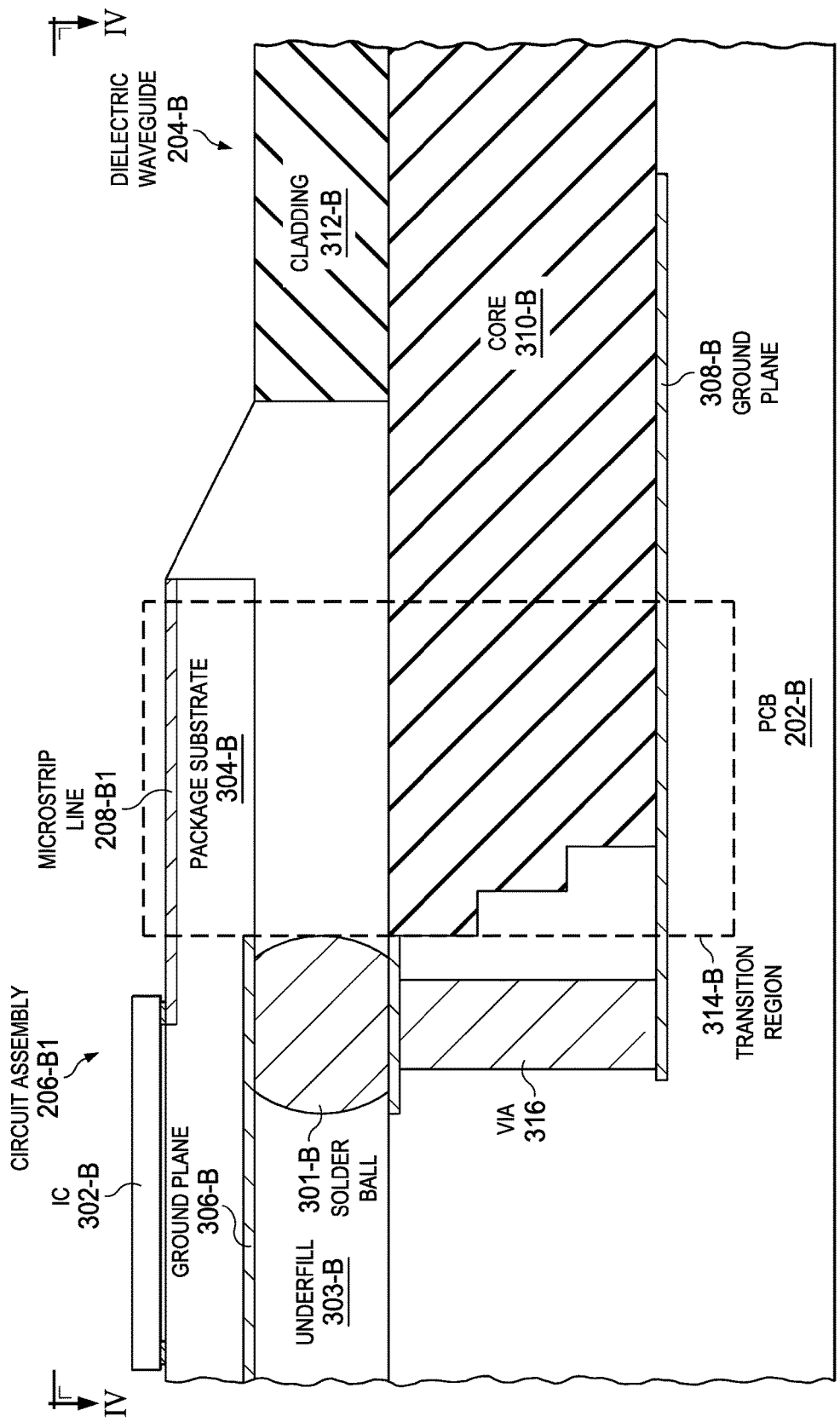
FIG. 8 is example cross-sectional view of the interconnect system of FIG. 7 along section lines IV-IV.

In FIGS. 7 and 8, one example configuration (system 200-B) for an antenna system and transition region 314-B can be seen. The antenna system for circuit assembly 206-B1 (for example) is generally comprised of microstrip line 208-B1 (which is located in the package substrate 304-B and which is electrically coupled to the IC 302-B) and ground plane 306-B (which is located within package substrate 304-B and which is generally parallel to and separated from a portion of the microstrip line 208-B1). For example, the portion the microstrip line 208-B1 (which is shown as extending from the IC 302-B to the boundary with the transition region 314-B) and ground plane 306-B can be separated by about 0.2 mm. The ground plane 308-B (which, as shown and for example, is located in PCB 202-B) is parallel to and separated from the portion of microstrip line 208-B1 within the transition region 314-B. The distance between the microstrip line 208-B1 can also, for example be, separated from the ground plan 308-B by a distance of about 1 mm. By having this configuration, the width of microstrip line 208-B1 and the distance between the microstrip line 208-B1 and ground plane 308-B can be dimensioned to provide a desired impedance (i.e., about 50Ω). Typically, for this example, the portions of the microstrip line 208-B1 are generally rectangular with the portion in the transition region being wider. For example, the widths can have a width to achieve a desired impedance of about 50Ω. As shown in this example, there is also a via 316 that extends from one side the ground plane 308-B to allow the ground plane 308-B to be electrically coupled to ground plane 306-B (i.e., through solder ball 301-B).

In FIGS. 9 and 10, another example configuration (system 200-C) for an antenna system and transition region 314-C can be seen. The antenna system for circuit assembly 206-C1 (for example) is generally comprised of microstrip line 208-C1 (which is located in the package substrate 304-C and which is electrically coupled to the IC 302-B), microstrip line 320-1 (which is located in the PCB 202-C), ground plane 306-C (which is located within package substrate 304-C and which is generally parallel with a portion of the microstrip line 208-C1), and via 318 (which extends between the one side of the package substrate 304-C and the microstrip line 208-C1 and which allow the microstrip line 208-C1 to be electrically coupled to the microstrip line 320-1 through solder ball 301-C"). For example, the portion the microstrip line 208-C1 (which is shown as extending from the IC 302-C to the boundary with the transition region 314-C) and ground plane 306-C can be separated by about 0.2 mm. The ground plane 308-B (which, as shown and for example, is located in PCB 202-B) is parallel to and separated from the portion of microstrip line 208-C1 within the transition region 314-C. The distance between the microstrip line 208-B1 can also, for example be, separated from the ground plan 308-B by a distance of about 1 mm. By having this configuration, the width of microstrip line 208-C1 and the distance between the microstrip line 208-B1 and ground plane 306-C can be dimensioned to provide a desired impedance (i.e., about 50Ω). Typically, for this example, one portion of the microstrip line 208-C1 (which is shown as extending from the IC 302-C to the transition region 314-C) has a width (i.e., about 25 µm) dimensioned to provide a desired impedance (i.e., about 50Ω), and another portion (which is shown as extending from the boundary of the transition region 314-C to the edge of package substrate 304-C) is dimensioned to allow a transition to the region between microstrip line 320-1 (which is also dimensioned to carry this radiation) and ground plane 308-B. Typically, the portion of the microstrip line 208-C1 which is shown as extending from the IC 302-C to the transition region 314-C is generally wider than portion of the microstrip line 208-C1 which is shown as extending from the boundary of the transition region 314-C to the edge of package substrate 304-C. As shown in this example, there is also a via 316 that extends from one side the ground plane 308-B to allow the ground plane 308-C to be electrically coupled to ground plane 306-C (i.e., through solder ball 301-C').

Figure 12:
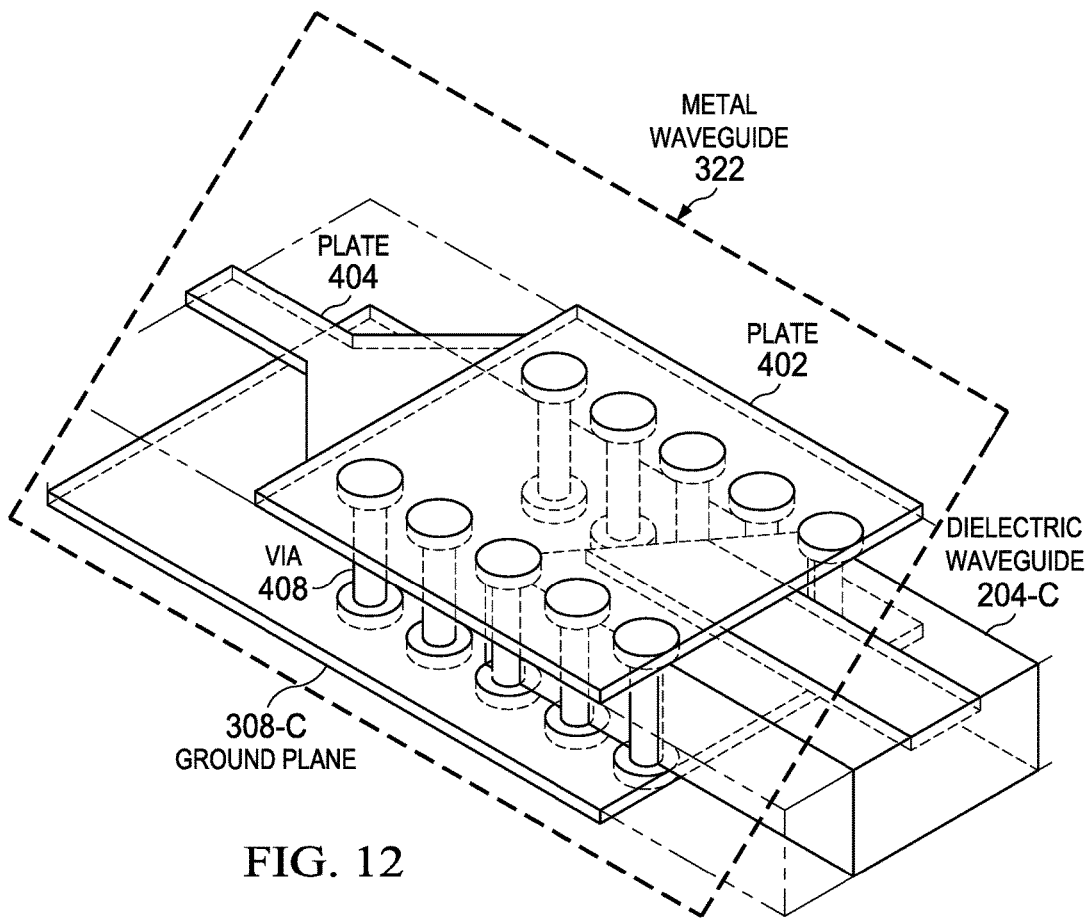
FIG. 12 is an isometric view of the metal waveguide of FIGS. 10 and 11.

As part of the transition region 314-C, there is also a metal waveguide 322 in which the core 310-C of the dielectric waveguide 204-C extends, and an example of the metal waveguide 322 is shown in FIG. 12. To achieve the desired coupling with the dielectric waveguide 204-C (for either of the system 200-B), the metal waveguide 322 can be formed of plates 402 and 404, ground plane 308-C, and vias 408. As shown in this example, plate 404 (which, for example, can be formed of copper and which is electrically coupled to microstrip line 320-1) includes a narrow portion and a tapered portion and is generally in parallel to plate 406 (which can, for example, be formed of copper). The width of the narrow portion of plate 404 is chosen to achieve a desired impedance (i.e., so as to match the impedance from the antenna system of system 200-C). Plate 402 can also be generally coplanar with and electrically coupled to plate 404. Additionally, vias 408 are shown in this example as extended between plate 402 and ground plane 308-C so that plates 402 and 404 and ground plane 308-C are electrically coupled together. The vias 408 are also spaced apart so that the dielectric waveguide 204-C can extend into the metal waveguide 322. Moreover, the shape of the end of the dielectric waveguide 204-C can affect the properties of the transition region 314-C, and, in this example, the end of the dielectric waveguide (which extends into the metal waveguide 322 is tapered. Other shapes, however, are possible.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:
1. An apparatus comprising:
   (a) a circuit board having a first side, a second side, an elongate channel formed in and open to the first side of the circuit board, and a first conductive ground plane that underlies at least a portion of the channel, the channel having opposed side walls that extend from the first side of the circuit board towards the second side of the circuit board, a bottom wall that extends between the side walls, and the side walls and the bottom wall are between the first and second sides of the circuit board, the circuit board having a first dielectric constant;
   (b) a package substrate that is secured to the first side of the circuit board, the package substrate including a second conductive ground plane that is electrically coupled to the first ground plane, and a conductive microstrip line that is substantially parallel to the first and second ground planes, the microstrip line having:
      (i) a first portion that overlays at least a portion of the second ground plane and that is separated from the second ground plane by a first distance, the first portion of the microstrip line being dimensioned to have an impedance to propagate radiation having a certain wavelength; and
      (ii) a second portion that overlays at least a portion of the first ground plane and that is separated from the first ground plane by a second distance, the second distance being greater than the first distance, the second portion of the microstrip line is dimensioned to have an impedance to propagate radiation having the certain wavelength, and the second portion of the microstrip line being located within a transition region;
   (c) an integrated circuit (IC) that is secured to the package substrate and that is electrically coupled to the first portion of the microstrip line; and
   (d) a dielectric waveguide core that overlies at least a portion of the first ground plane, that extends under the second portion of the microstrip line in the transition region, and that is secured in and extends through the channel, the dielectric waveguide core having a second dielectric constant different from the first dielectric constant.
2. The apparatus of claim 1 in which the wavelength is less than or equal to about 1 mm.
3. The apparatus of claim 1 including a cladding above the dielectric waveguide core, the core having a first dielectric constant, the cladding having a second dielectric constant, and the first dielectric constant is greater than the second dielectric constant.

4. The apparatus of claim 1 in which the package substrate has first and second sides, the microstrip line is formed on the first side of the package substrate, the IC is secured to the first side of the package substrate, and the first ground plane is formed on the second side of the package substrate.

5. The apparatus of claim 1 in which the circuit board includes a via that extends from the first ground plane to the first side of the circuit board, and including a solder ball that extends between the second ground plane and the via.

6. The apparatus of claim 1 in which the impedance is about 50 ohms.

7. The apparatus of claim 1 in which the first portion of the microstrip line is generally rectangular.

8. An antenna system comprising:
  (a) an elongate circuit board having a first side, a second side, an elongate channel, and a first conductive ground plane, the channel being formed in the first side of the circuit board, being open to the top of the first side of the circuit board, and having an end portion with an end wall, the first conductive ground plane being formed in the first side of the circuit board and extending under the end portion of the channel, the channel having opposed side walls that extend from the first side of the circuit board towards the second side of the circuit board, a bottom wall that extends between the side walls, and the side walls and the bottom wall are between the first and second sides of the circuit board, the circuit board having a first dielectric constant;
  (b) a package substrate that is secured to the first side of the circuit board, the package substrate including a second conductive ground plane that is electrically coupled to the first ground plane, and a conductive microstrip line that is substantially parallel to the first and second ground planes, the microstrip line having:
    (i) a first portion that overlays at least a portion of the second ground plane and that is separated from the second ground plane by a first distance, the first portion of the microstrip line being dimensioned to have an impedance to propagate radiation having a certain wavelength; and
    (ii) a second portion that overlays at least a portion of the first ground plane and the end portion of the channel, and that is separated from the first ground plane by a second distance, the second distance being greater than the first distance, and the second portion of the microstrip line is dimensioned to have an impedance to propagate radiation having the certain wavelength, and the second portion of the microstrip line being located within a transition region;
  (c) an integrated circuit (IC) that is secured to the package substrate and that is electrically coupled to the first portion of the microstrip line; and
  (d) a dielectric waveguide core formed in the channel and extending through the channel and having an end portion extending into the end portion of the channel, the dielectric waveguide core having a second dielectric constant different from the first dielectric constant.

9. The antenna system of claim 8 in which the wavelength is less than or equal to about 1 mm.

10. The antenna system of claim 8 in which the dielectric waveguide core in the channel has a top surface coplanar with the top side of the circuit board.

11. The antenna system of claim 8 including cladding above the dielectric waveguide core, the core having a first dielectric constant, the cladding having a second dielectric constant, and the first dielectric constant is greater than the second dielectric constant.

12. The antenna system of claim 8 in which the package substrate has first and second sides, the microstrip line is formed on the first side of the package substrate, the IC is secured to the first side of the package substrate, and the first ground plane is formed on the second side of the package substrate.

13. The antenna system of claim 8 in which the circuit board includes a via that extends from the first ground plane to the first side of the circuit board, and including a solder ball that extends between the second ground plane and the via.

14. The antenna system of claim 8 in which the impedance is about 50 ohms.

15. The antenna system of claim 8 in which the first portion of the microstrip line is generally rectangular.

16. The antenna system of claim 8 in which the end wall is stepped and the end portion of the core is stepped.

17. The antenna system of claim 8 including underfill between the package substrate and the end portion of the dielectric waveguide core in the end portion of the channel.

18. The antenna system of claim 8 in which the microstrip line includes a portion coupled through a via and a solder ball to over the end portion of the core extending into the end portion of the channel.

* * * * *